(12) United States Patent
Jung et al.

(10) Patent No.: US 8,531,037 B2
(45) Date of Patent: Sep. 10, 2013

(54) SEMICONDUCTOR CHIP HAVING POWER SUPPLY LINE WITH MINIMIZED VOLTAGE DROP

(75) Inventors: Yong-Icc Jung, Incheon-si (KR); Dae-Keun Han, Daejeon-si (KR); Dae-Seong Kim, Daejeon-si (KR); Joon-Ho Na, Daejeon-si (KR)

(73) Assignee: Silicon Works Co., Ltd., Daejeon-Si (KR)

( * ) Notice: Subject to any disclaimer, the term of this patent is extended or adjusted under 35 U.S.C. 154(b) by 201 days.

(21) Appl. No.: 12/740,316

(22) PCT Filed: Oct. 27, 2008

(86) PCT No.: PCT/KR2008/006321
§ 371 (c)(1),
(2), (4) Date: Apr. 28, 2010

(87) PCT Pub. No.: WO2009/061091
PCT Pub. Date: May 14, 2009

(65) Prior Publication Data
US 2010/0308472 A1    Dec. 9, 2010

(30) Foreign Application Priority Data
Nov. 6, 2007    (KR) .................. 10-2007-0112420

(51) Int. Cl.
*H01L 29/40* (2006.01)

(52) U.S. Cl.
USPC ........... 257/775; 438/638; 257/173; 257/355; 257/356; 257/360; 257/728; 361/56; 326/30

(58) Field of Classification Search
USPC ............. 257/173, 775, 207–208, 211, 299, 257/355, 356, 360, 728; 438/638; 361/56; 326/30
See application file for complete search history.

(56) References Cited

U.S. PATENT DOCUMENTS 4,745,450 A * 5/1988 Hartranft et al. .............. 257/360
5,708,550 A * 1/1998 Avery ............................. 361/56

(Continued)

FOREIGN PATENT DOCUMENTS

JP    07-106522 A    4/1995
KR    1991-0007097 A    4/1991

(Continued)

OTHER PUBLICATIONS

PCT International Search Report of International Application No. PCT/KR2008/006321.

(Continued)

*Primary Examiner* — Fernando L Toledo
*Assistant Examiner* — Mohammed Shamsuzzaman
(74) *Attorney, Agent, or Firm* — Kile Park Reed & Houtteman PLLC

(57) ABSTRACT

Disclosed is a power supply line in which a voltage drop generated in a resistance component of a metal line which delivers a power voltage is minimized so that the level of the power supply voltage delivered to a semiconductor chip becomes constant in the entire area of the semiconductor chip. The semiconductor chip includes: at least two power supply pads to which a power voltage applied from an external unit of the semiconductor chip is supplied; power supply main metal lines connected to each of the power supply pads; power supply branch metal lines extended from each of the power supply main metal lines to deliver a power voltage to a circuit in the semiconductor chip; and at least an electrostatic discharge (ESD) improvement dummy pad, wherein the ESD improvement dummy pad is electrically connected to the corresponding power supply main metal line and the corresponding power supply branch metal line to minimize a voltage drop.

4 Claims, 2 Drawing Sheets

(56) References Cited

U.S. PATENT DOCUMENTS

| | | | |
|---|---|---|---|
| 6,046,897 A * | 4/2000 | Smith et al. | 361/111 |
| 6,320,735 B1 * | 11/2001 | Anderson | 361/111 |
| 6,460,168 B1 * | 10/2002 | Yamamoto et al. | 323/234 |
| 6,559,508 B1 * | 5/2003 | Lin et al. | 257/360 |
| 6,566,904 B2 * | 5/2003 | van Bavel et al. | 326/30 |
| 6,684,378 B2 * | 1/2004 | Yamamoto et al. | 716/120 |
| 6,900,970 B2 * | 5/2005 | Miller et al. | 361/56 |
| 6,925,627 B1 * | 8/2005 | Longway et al. | 257/207 |
| 7,137,096 B2 * | 11/2006 | Lin | 257/532 |
| 7,176,539 B2 * | 2/2007 | Chen | 257/409 |
| 7,256,604 B1 * | 8/2007 | Ota et al. | 324/762.01 |
| 7,325,177 B2 * | 1/2008 | Tran et al. | 714/718 |
| 7,372,681 B2 * | 5/2008 | Armer et al. | 361/56 |
| 7,623,364 B2 * | 11/2009 | Sasaki et al. | 365/51 |
| 7,692,247 B2 * | 4/2010 | Woo et al. | 257/355 |
| 7,872,891 B2 * | 1/2011 | Sasaki et al. | 365/51 |
| 7,956,833 B2 * | 6/2011 | Ito et al. | 345/87 |
| 2002/0042902 A1 * | 4/2002 | Yamamoto et al. | 716/1 |
| 2002/0163355 A1 * | 11/2002 | van Bavel et al. | 326/30 |
| 2004/0001293 A1 * | 1/2004 | Woo | 361/56 |
| 2004/0073878 A1 * | 4/2004 | Hasegawa et al. | 716/8 |
| 2005/0097492 A1 * | 5/2005 | Matsumura et al. | 716/10 |
| 2005/0204324 A1 * | 9/2005 | Lin | 716/13 |
| 2007/0013634 A1 * | 1/2007 | Saiki et al. | 345/98 |
| 2007/0205506 A1 * | 9/2007 | Dragon et al. | 257/728 |
| 2007/0205794 A1 * | 9/2007 | Ota et al. | 324/765 |
| 2007/0297105 A1 * | 12/2007 | Brennan et al. | 361/56 |
| 2008/0218920 A1 * | 9/2008 | Vanysacker et al. | 361/56 |
| 2009/0067235 A1 * | 3/2009 | Tran et al. | 365/185.03 |
| 2009/0251834 A1 * | 10/2009 | Kobashi | 361/56 |
| 2010/0091567 A1 * | 4/2010 | Tran et al. | 365/185.03 |
| 2011/0022905 A1 * | 1/2011 | Tran et al. | 714/721 |
| 2011/0085400 A1 * | 4/2011 | Sasaki et al. | 365/226 |

FOREIGN PATENT DOCUMENTS

| | | |
|---|---|---|
| KR | 1020000002030 A | 1/2000 |
| KR | 1020020052647 A | 7/2002 |
| KR | 1020060026352 A | 3/2006 |

OTHER PUBLICATIONS

PCT Written Opinion of the International Search Authority of International Application No. PCT/KR2008/006321.

* cited by examiner

SEMICONDUCTOR CHIP HAVING POWER SUPPLY LINE WITH MINIMIZED VOLTAGE DROP

BACKGROUND OF THE INVENTION

1. Field of the Invention

The present invention relates to a semiconductor chip, and more particularly, to a semiconductor chip having a power supply line with a minimized voltage drop using an ESD dummy pad.

2. Description of the Related Art

A power supply should be provided in order to normally operate circuits implemented in a semiconductor chip. A power voltage supplied from an external unit of the semiconductor chip is supplied to an internal unit of the semiconductor chip through a power supply pad integrated in the semiconductor chip. The circuit implemented in the semiconductor chip may operate between a ground voltage and a unit power source or between a plurality of power voltages having different voltage levels. In this case, the ground voltage may be included or not in a plurality of power voltages having different voltage levels.

The externally supplied power voltage is delivered to internal circuits of the semiconductor chip through a power supply pad and a metal line connected to the power supply pad. In order to uniformly deliver the power voltage to the entire area of the semiconductor chip, the metal line used to supply the power voltage is typically laid out along edges of the semiconductor chip. Though the metal line for delivering the power voltage has a metal component, it still has a small amount of resistance component, and a voltage drop generated in the resistance component should be considered. Therefore, in order to minimize the resistance component, the width of the metal line for delivering the power voltage is designed to be larger than those of other metal lines used in the circuit. Unfortunately, no matter how large the width of the metal line for delivering the power voltage becomes, the larger distance from the power supply pad it has, the lower voltage level is inevitable in comparison with the voltage level of the power supply pad. This is because a serial resistance component increases as the distance from the power supply line increases.

A semiconductor chip for driving a single display panel has a significant number of signals supplied to the corresponding display panel. In consideration of symmetry of the delivered signals, the signals are preferably output from a pad mounted on one side of the semiconductor chip for driving the display panel. For this reason, a plurality of pads are concentrated on one side of the semiconductor chip for driving the display panel, and the semiconductor chip for driving the display panel is designed in a rectangular shape rather than a square shape.

FIG. 1 is a layout of a semiconductor chip having a rectangular shape.

Referring to FIG. 1, although the power supply pad area INPUT arranged near an upper center edge of the semiconductor chip is illustrated as a single rectangular shape, the number of pads arranged in the pad area INPUT may correspond to the number of supplied power voltages. For example, if two power voltages VDD and VSS are supplied, the power supply pad area INPUT may have at least two power supply pads. In FIG. 1, two power voltages VDD and VSS are delivered to internal circuits through a power supply main metal line which forms a closed loop along edges of the semiconductor chip. In order to supply the power voltages to the circuits (i.e., Channel Block and Control Block) arranged in the center of the semiconductor chip, a power supply branch metal line extended from the power supply main metal line laid out along the edges is used. A plurality of rectangles arranged in the edges of the semiconductor chip shown in FIG. 1 are pads for inputting/outputting signals.

Referring to FIG. 1, it is recognized that two power voltages VDD and VSS are supplied to the circuits (i.e., Channel Block and Control Block) arranged in the center of the semiconductor chip through the power supply branch metal lines extended from two power supply main metal lines VDD and VSS forming a closed loop along the edges of the semiconductor chip.

It would be readily anticipated that the voltage level of the power supply main metal line at a certain point (e.g., the A-point) located in the lower center edge of the semiconductor chip quite far from the power supply pad area INPUT is lower than the voltage level at the power supply pad area INPUT. This is because a voltage drop may be generated due to the resistance component in the power supply metal lines when the current flows from the power supply pad INPUT to the A-point (as in the arrow direction).

Particularly, since the power supply branch metal line extended from the power supply main metal line has a relatively narrow width, its resistance is relatively large. The power voltage is supplied to the internal circuits of the semiconductor chip through the power supply branch metal line. The more distant from the power supply pad the internal circuit is located, the more voltage drop may be generated.

Recently, there is tendency to reduce the amplitude of the signal exchanged in the circuit in order to lower power consumption in a semiconductor integrated circuit. Such a design strategy also reduces a design margin of the amplitude of the signal. If the level of the power voltage supplied to a reference circuit having a single function is different from the level of the power voltage delivered to a neighboring circuit which exchanges signals with the reference circuit, there may be errors in determining logic values of the signals exchanged between the reference circuit and the neighboring circuit.

SUMMARY OF THE INVENTION

The present invention provides a semiconductor chip having a power supply line with a minimized voltage drop generated in a resistance component of the metal line for delivering a power voltage so that the level of the power voltage supplied to the semiconductor chip can be constant in the entire area of the semiconductor chip.

According to an aspect of the present invention, there is provided a semiconductor chip having a power supply line with a minimized voltage drop, the semiconductor chip includes: at least two power supply pads to which a power voltage applied from an external unit of the semiconductor chip is supplied; power supply main metal lines connected to each of the power supply pads; power supply branch metal lines extended from each of the power supply main metal lines to deliver a power voltage to a circuit in the semiconductor chip; and at least an electrostatic discharge (ESD) improvement dummy pad, wherein the ESD improvement dummy pad is electrically connected to the corresponding power supply main metal line and the corresponding power supply branch metal line to minimize a voltage drop.

According to an aspect of the present invention, there is provided a semiconductor chip wherein the ESD improvement dummy pad is arranged in an intersection between the power supply main metal line and the power supply branch metal line or arranged along edges of the semiconductor chip.

According to an aspect of the present invention, there is provided a semiconductor chip wherein the ESD improvement dummy pad is arranged farthest from the power supply pad.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, exemplary embodiments of the present invention will be described in detail with reference to the accompanying drawings.

Figure 2:
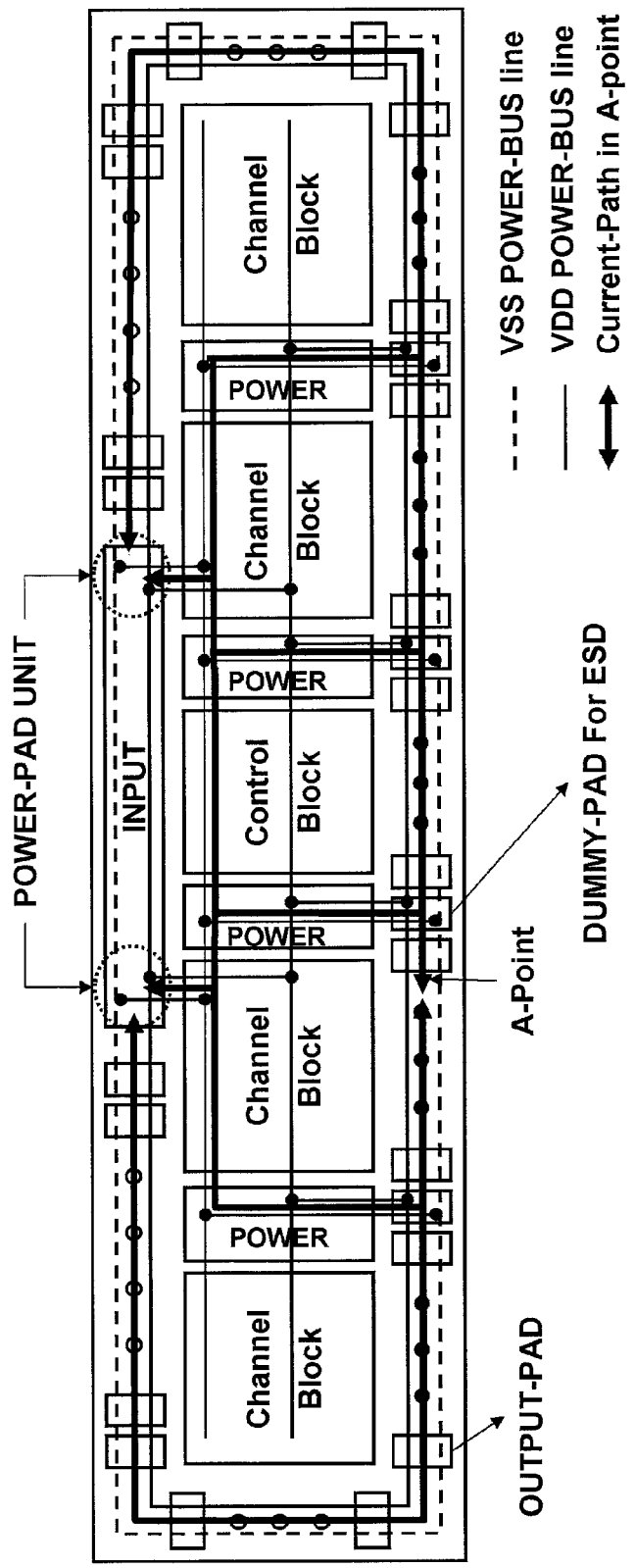
FIG. 2 illustrates an exemplary embodiment of a semiconductor chip having a power supply line with a minimized voltage drop according to the present invention.

FIG. 2 illustrates an exemplary embodiment of a semiconductor chip having a power supply line with a minimized voltage drop according to the present invention.

Referring to FIG. 2, the semiconductor chip has two power voltages VDD and VSS supplied from the power supply pad area INPUT arranged near the center of its long side. The two power voltages VDD and VSS are delivered to the circuits through a power supply main metal line forming a closed loop along the edges of the semiconductor chip. The power voltages are supplied to the circuits (e.g., Channel Block and Control Block) arranged in the center of the semiconductor chip through a power supply branch metal line extended from the power supply main metal line arranged along the edges.

Figure 1:
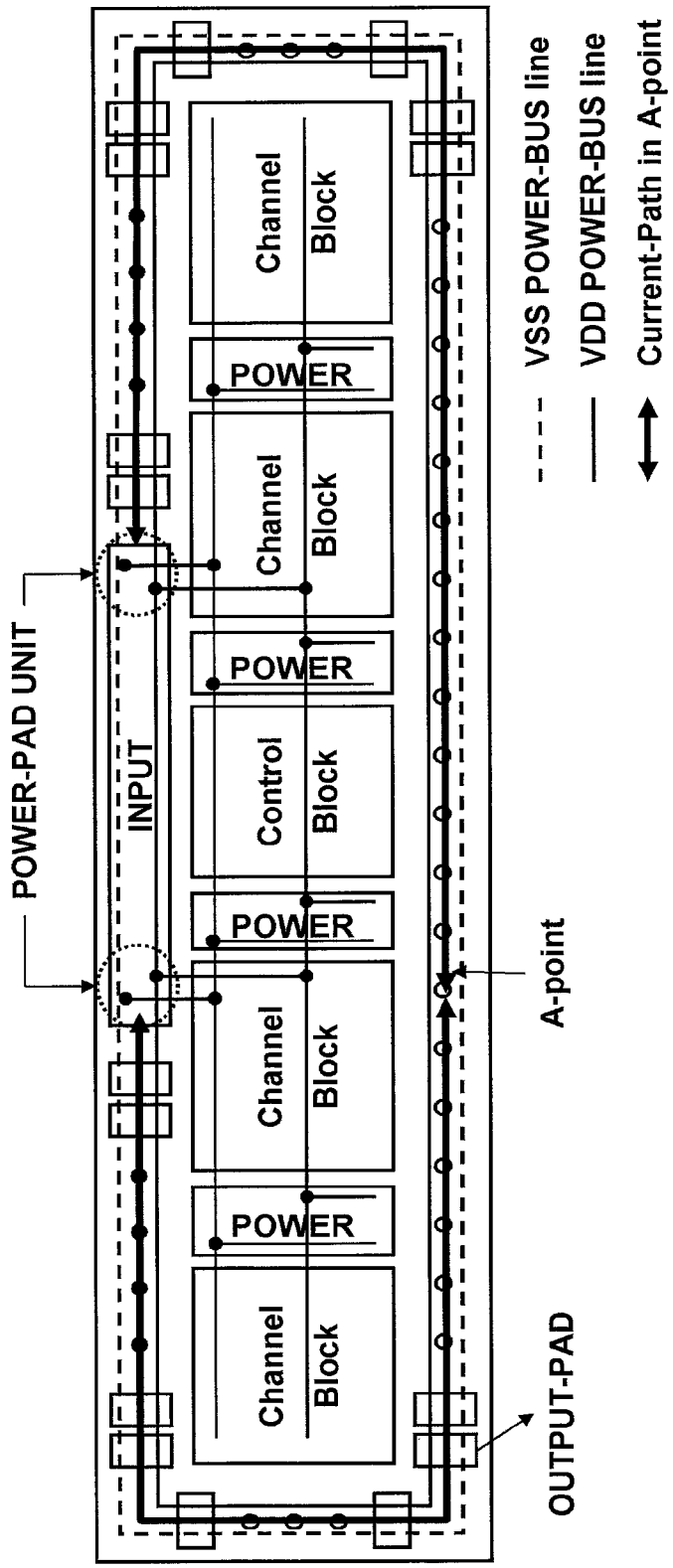
FIG. 1 is a layout illustrating a rectangular semiconductor chip.

The semiconductor chip according to the present invention is different from the conventional semiconductor chip shown in FIG. 1 in that an ESD improvement dummy pad is further provided as follows:

1. the ESD improvement dummy pad is connected to the power supply main metal line, and
2. the power supply branch metal line is extended from the ESD improvement dummy pad and connected to the conventional power supply branch metal line that have supplied the power voltages to the internal circuits of the semiconductor chip.

A metal line has a relatively smaller specific resistance than other line components formed of poly-silicon or diffusion areas having the same size, but it does not have no resistance. Therefore, when the current flows through the metal line, heat is generated depending on the resistance value in the current flow direction. In order to reduce the resistance component in the current flowing through the metal line, the width of the metal line should increase. However, if the width is designed large for all metal lines, the area of the chip also becomes large. Therefore, the width of the metal line should be determined in consideration of a trade-off between the heat that will be generated and economy of the chip.

The metal line flowing the largest amount of current in a semiconductor chip is a power supply metal line for delivering an external power voltage to internal circuits. Therefore, a resistance component is reduced by increasing the width of the power supply metal line. It should be noted that no matter how the width of the power supply metal line increases, its resistance cannot be zero. Therefore, with respect to the voltage level of the power supply pad to which the power voltage externally supplied to the semiconductor chip is firstly connected, as the power supply metal line for delivering the power voltage to the internal circuits is located farther from the power supply pad, a voltage drop generated in a resistance component of the metal line inevitably increases.

The number of elements integrated in a semiconductor chip has been increased while its size has been reduced. Accordingly, the elements become vulnerable to external electro-static discharge (ESD). In order to solve this problem, an ESD improvement dummy pad is mounted. As recognized from its name, the dummy pad does not function as a pad (i.e., is not used in practical) to connect a chip to an external system, but it is used only to improve an ESD property of a chip. Therefore, if the ESD improvement dummy pad is appropriately applied, additional effects can be obtained without affecting other operations of a chip.

In a semiconductor chip according to the present invention, the ESD improvement dummy pad used for the power voltages VDD and VSS may be any type of dummy pad regardless of whether or not there is a semiconductor device under the dummy pad. In general, there is a semiconductor pad under a typical output pad used for a power supply or input/output signals.

According to the present invention, the power supply main metal line is connected to the ESD improvement dummy pad, and the power voltage is supplied from the ESD improvement dummy pad to the internal circuits. Conventionally, the power voltage was also supplied to the internal circuits through the power supply branch metal line extended from the power supply main metal line. However, the practical level of the power voltage supplied to the circuits located far from the power supply pad was lower than the practical level of the power voltage supplied to the circuits located near the power supply pad. This shortcoming can be overcome and the voltage drop generated from the resistance component of the power supply branch metal line can be minimized by connecting the conventional power supply branch metal line and the power supply branch metal line extended from the ESD improvement dummy pad. The ESD improvement dummy pad is directly connected to the power supply main metal line which is located far from the power supply pad but has little voltage drop.

Conventionally, the power supply main metal line has been designed as wide as possible in consideration of a voltage drop in the power supply line. This was the reason why the area of the chip increases. According to the present invention, since the width of the power supply line can be reduced in comparison with the conventional one, it is possible to reduce the area of the chip.

Although not shown obviously in the drawings, the width of the power supply main metal line is laid out larger than that of the power supply branch metal line. In addition, the location and the number of the ESD improvement pads shown in the drawings may be changed depending on condition.

According to the present invention, it is possible to reduce a resistance component in a power supply line, and also reduce the area of the chip by reducing the line width of the power supply line.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A semiconductor chip having a power supply line with a minimized voltage drop, the semiconductor chip comprising:

a circuit positioned in a center region of the semiconductor chip;

a VDD main line extending around the circuit;

a VSS main line extending around the circuit;

a first branch line connected to the VDD main line and the circuit;

a second branch line connected to the VSS main line and the circuit;

a first power supply pad positioned on a first edge of the semiconductor chip, connected to the VDD main line, and configured to provide VDD power to the circuit via the VDD main line and the first branch line;

a second power supply pad positioned on the first edge of the semiconductor chip, connected to the VSS main line, and configured to provide VSS power to the circuit via the VSS main line and the second branch line; and a plurality of electrostatic discharge (ESD) improvement dummy pads each connected to the VDD main line, the VSS main line, a third branch line, and a fourth branch line, wherein each of the ESD improvement dummy pads is configured to provide VDD power from the VDD main line to the circuit via its respective third branch line, wherein each of the ESD improvement dummy pads is configured to provide VSS power from the VSS main line to the circuit via its respective fourth branch line, and wherein each of the ESD improvement dummy pads is positioned far from the first and second power supply pads on a second edge of the semiconductor chip opposite from the first edge of the semiconductor chip.

2. The semiconductor chip according to claim 1, wherein the VDD main line is laid out along edges of the semiconductor chip, and has a width larger than that of the first branch line.

3. The semiconductor chip according to claim 1, wherein the circuit comprises one or more channel blocks and one or more control blocks.

4. The semiconductor chip according to claim 1, wherein the first power supply pad receives VDD power from a first power supply.

* * * * *